(12) United States Patent
Dougherty et al.

(10) Patent No.: US 8,050,878 B2
(45) Date of Patent: Nov. 1, 2011

(54) METHOD AND SYSTEM FOR ESTIMATION OF SOURCE IMPEDENCE ON ELECTRICAL DISTRIBUTION LINES

(75) Inventors: John James Dougherty, Collegeville, PA (US); Dale Finney, Oshawa (CA); Senthoor Navaratnam, Markham (CA)

(73) Assignee: General Electric Company, Schenectady, NY (US)

( * ) Notice: Subject to any disclaimer, the term of this patent is extended or adjusted under 35 U.S.C. 154(b) by 397 days.

(21) Appl. No.: 12/270,417

(22) Filed: Nov. 13, 2008

(65) Prior Publication Data
US 2010/0121594 A1   May 13, 2010

(51) Int. Cl.
*G01R 27/16* (2006.01)
*G01R 35/00* (2006.01)
(52) U.S. Cl. ............ 702/64; 702/65; 702/194; 324/538; 324/539; 324/540; 324/541; 324/542; 324/543; 324/544; 324/545; 324/546; 324/547; 324/691; 361/56; 361/57; 361/58; 361/60; 361/63; 361/65
(58) Field of Classification Search .................... 702/64, 702/65, 194; 324/538–547, 691; 361/56–58, 361/60, 63, 65
See application file for complete search history.

(56) References Cited

U.S. PATENT DOCUMENTS
7,283,905 B1   10/2007   Beesley et al.

FOREIGN PATENT DOCUMENTS
EP   0665625 A2   8/1995

OTHER PUBLICATIONS

Gomez et al. "A Novel Methodology to Locate Originating Points of Voltage Sags in Electric Power Systems." Jun. 6-9, 2005.*
International Search Report issued in connection with corresponding PCT Application No. PCT/US09/59463 on Jun. 9, 2010.
International Written Opinion issued in connection with corresponding PCT Application No. PCT/US09/59463 on Jun. 9, 2010.

* cited by examiner

*Primary Examiner* — Sujoy Kundu
(74) *Attorney, Agent, or Firm* — GE Global Patent Operation; Mark A. Conklin

(57) ABSTRACT

A device and method for dynamically determining an impedance of a network is disclosed. The device includes at least a processing system for measuring a network voltage and network current when said network is determined to be in a first state, measuring a network voltage when said network is determined to be in a second state, estimating said impedance value dependent upon said measured voltages and current, adapting said estimated impedance based on at least one prior impedance value and storing at least said adapted impedance.

12 Claims, 4 Drawing Sheets

METHOD AND SYSTEM FOR ESTIMATION OF SOURCE IMPEDENCE ON ELECTRICAL DISTRIBUTION LINES

BACKGROUND OF THE INVENTION

High voltage electrical distribution grid networks provide the means for transferring electrical energy from the generator source to distribution centers, to feeder networks and, eventually, to individual consumers.

Typically, the high voltage distribution networks are relatively stable in their construction and configuration. Such networks are planned in advance to provide electrical energy from generators to the distribution centers to the residential and commercial customers. Distribution centers and feeder networks, therefrom, however, may have configurations that change in response to specific conditions. For example, a distribution center may be configured or reconfigured to accommodate additional service areas or customers within a known service area. Similarly, the high voltage network configuration may change with the addition of new generation capacity and/or new distribution centers. Network switching in order to accommodate maintenance of a circuit element or to isolate a faulted circuit element will likewise change the configuration of the system.

Generally, the characteristics of the networks are determined or estimated when the network is created. In accordance with known procedures, the determined or estimated characteristics of the network are generally formulated when the network is installed and not updated as changes to the system are made. In one aspect, an impedance ratio, referred to as an SIR, may be formulated based on models of the network characteristics between distribution centers, or represent actual measurement of network characteristics or be a combination of measured values and network models.

These characteristics are used in many cases as reference values that may be used in monitoring the health of the system or in determining actions to be performed. When the measured values exceed or fall outside of tolerable ranges, an error may be declared and one or more safety mechanisms within the network may be triggered. For example, if a circuit failure occurs, one or more measured values may fail outside a desired range and safety relays may be triggered to isolate the failure from the network.

For example, in the case of a circuit failure, to prevent the failure from being propagated through the network, a distribution center may include safety devices that determine the electrical distance of the failure from the safety device. If the failure is determined to be within a coverage region, based on a determined distance between the failure and the distribution, the distribution center may cause one or more actions to occur to isolate the failure from the network.

However, the distance determination is based in part of the estimated network characteristics and as the network is updated, the estimated network characteristics are not representative of the actual network characteristics. Thus, the determined distance measurement to the detected failure may be incorrectly determined and a distribution center not affected by the failure may initiate actions that are unnecessary.

Further still, as the actual network characteristics change, the tolerance values, which are based on the initially estimated values, and used to monitor the network may no longer be appropriate.

Hence, there is a need in the industry for a method to determining network characteristics as the network is changed and to use this information to adapt tolerance values accordingly.

SUMMARY OF THE INVENTION

As described herein, the embodiments of the present invention overcome one or more of the above or other disadvantages known in the art.

One aspect of the present invention relates to a method for performing a measurement of network characteristics.

Another aspect of the present invention relates to a method for providing updated network characteristics that may be used in distance determinations.

Another aspect of the present invention relates to a system for monitoring a network to determining network characteristics and to update the network characteristics.

These and other aspects and advantages of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. Moreover, the drawings are not necessarily drawn to scale and that, unless otherwise indicated, they are merely intended to conceptually illustrate the structures and procedures described herein.

DETAILED DESCRIPTION OF THE PREFERRED EMBODIMENTS OF THE INVENTION

Figure 1:
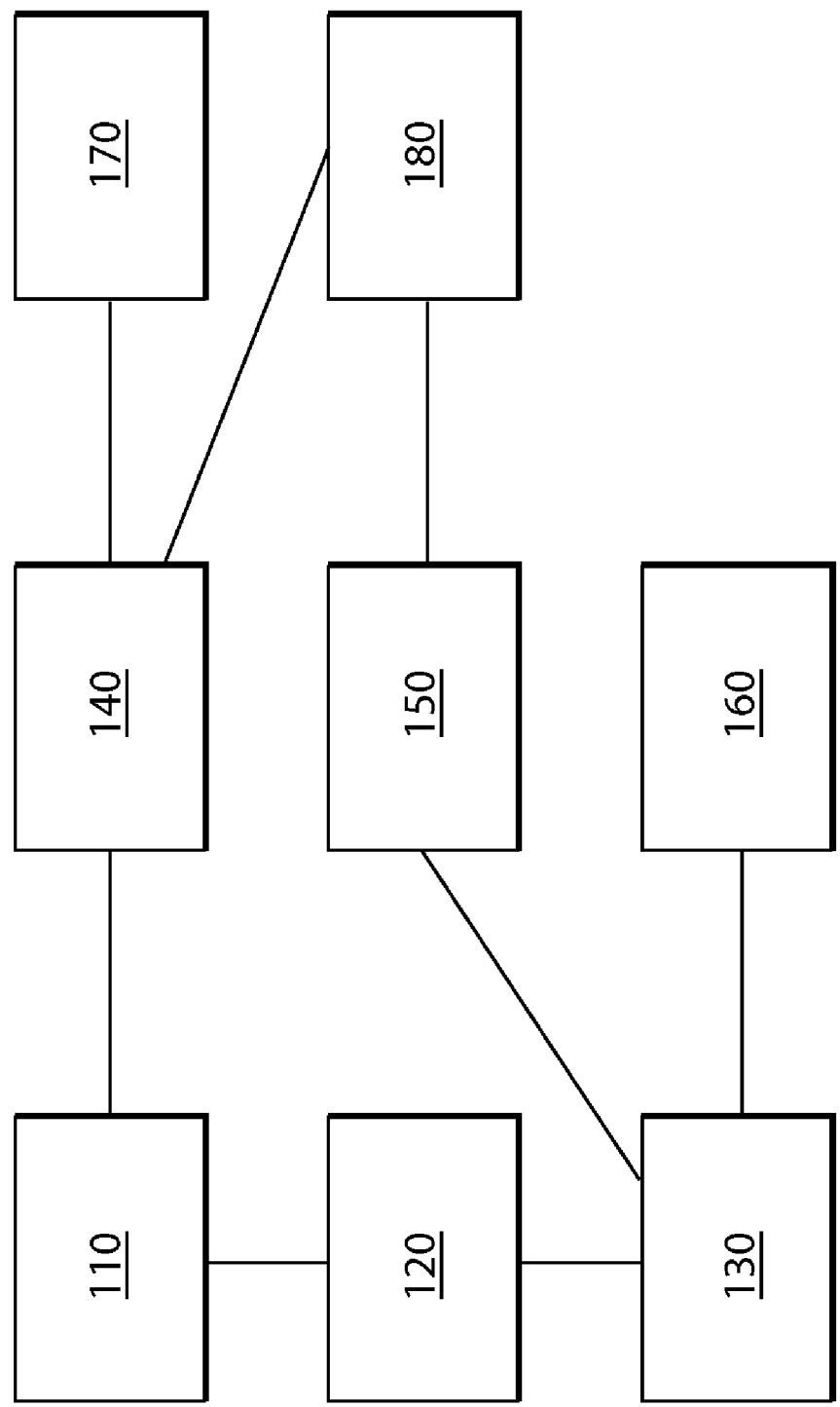
FIG. 1 illustrates a conventional network configuration.

FIG. 1 illustrates a conventional high tension electrical distribution system 100 composed of a plurality of interconnected substations 110, 120, . . . 180, that provide substations for the receipt and distribution of high-tension voltage. Substation 110, 120 . . . 180, referred hereinafter as 110, provide for the transfer and distribution among a plurality of connected feeder networks that may distribute electrical energy to residential and/or commercial customers.

Each substation 110 may include safety equipment that provides for backup and redundant paths in case of a detected failure. Generally, the substation 110 either detects a change in the characteristics of the network or an indication of a failure. In response, the substation 110 may determine an electrical distance to the detected failure. In one aspect, a distance determination may be based on the SIR. When the distance is within the coverage area of the substation 110, then the substation initiates actions to isolate the failure.

However, as noted previously, an incorrect SIR may cause an incorrect distance measurement and, consequently, an incorrect action by the substation.

Figure 2:
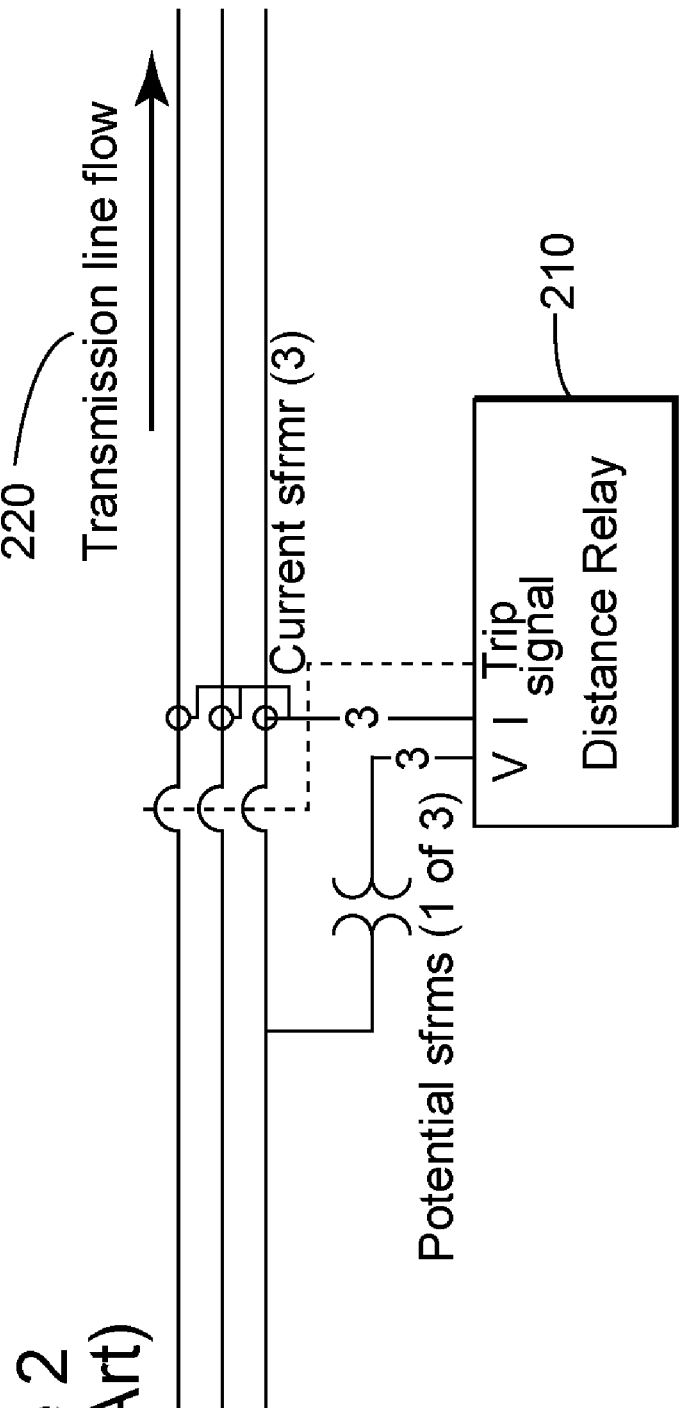
FIG. 2 a block diagram of a conventional distance relay.

FIG. 2 illustrates a conventional distance relay 210 monitoring a conventional transmission line 220. The distance relay 210 may, for example, monitor a voltage and/or current phase or a combination of voltage and current and compare the monitored voltage/current phase against known tolerance values. When the voltage/current phase exceeds the known tolerance values, the distance relay may generate a trip signal to isolate a suspected fault from the network. In generating the trip signal the distance relay may determine a distance to the suspected fault. When the determined distance exceeds a known distance, then the distance relays will trip after a known delay to allow distance relays closer to the fault to operate first. Accordingly, when the determined distance is within a known distance, then the distance relay 210 may generate the trip signal almost immediately.

Figure 3:
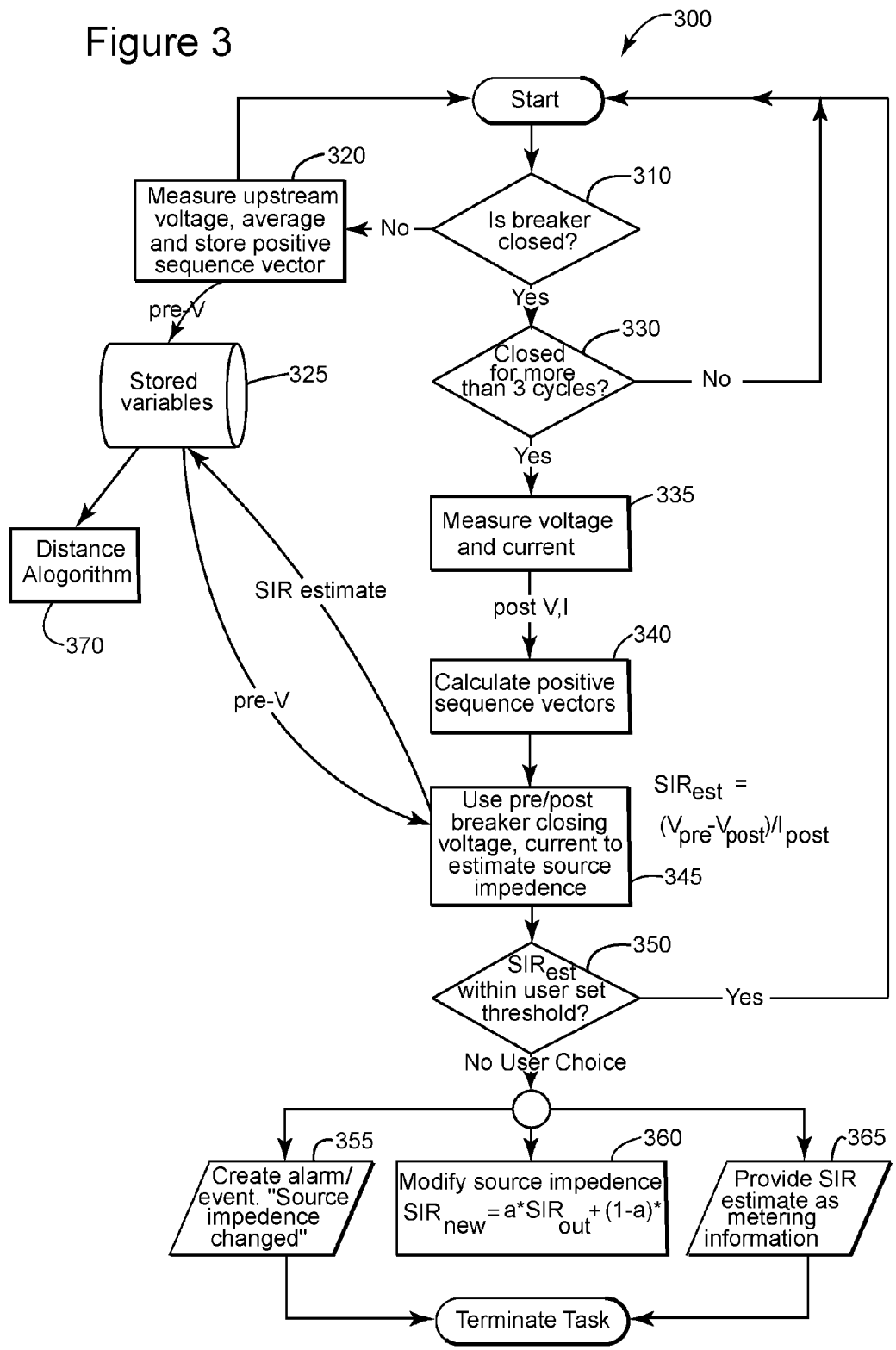
FIG. 3 is a flow chart of processing in accordance with the principles of the present invention.

FIG. 3 illustrates a flow chart of an exemplary process 300 for monitoring and updating network characteristics in accordance with the principles of the invention. At block 310 a determination is made whether an electrical breaker within a substation, for example, is closed. If the answer is negative, then, characteristics, such as upstream voltage is determined at block 320 and stored in a data base 325. The measured upstream voltage is referred to as "pre-V." The measured values may be collected on a periodic basis while the breaker is open. The measured value(s) may be individually stored on database 325 or may be processed to produce an averaged or otherwise filtered value. For example, the plurality of values collected during one or more time periods may be averaged together using a straight average to produce a representative value of pre-V. In another aspect, an average value may be determined by including only a portion of recent values to an existing accumulated value. In this case, the effects of singularities in the measurement may be reduced. Other known methods may be employed to determine a value of "pre-V" and need not be discussed in detail, herein. However, the use of such methods are contemplated and considered to be within the scope of the invention.

If the breaker is determined to be closed at block 310, a determination is made at block 330 whether the breaker has been closed for a predetermined period of time. In the illustrated example, the predetermined period is based on a number of cycles, e.g., 3, however, it would be recognized that predetermined period may be a fixed time or based on a plurality of cycles.

If the breaker is not closed for a predetermined time, processing returns to step 310.

Otherwise, a measurement of voltage and current, in this breaker closed condition, is made at block 335. The measured voltage post breaker closure, is referred to as "post-V." At block 340, positive sequence vectors associated with the post-V measured voltage and post-I current are determined. Positive sequence vectors represent the measured voltage and current as a magnitude and phase. Determination of positive sequence vectors are known in the art and need not be discussed in detail herein.

At block 345, an estimated source impedance may be determined as a difference between the pre-V and the post-V values. In one aspect of the invention, a estimated source impedance ($SIR_{est}$) may be determined as:

$$(SIR_{est}) = (((pre-V) - (post-V))/post-I)$$

The previous discussion describes a method for estimating SIR for a breaker close operation. However it is also possible to make a similar estimate after the breaker has closed and the voltage collapses due to a fault.

At block 350, a determination is made whether the estimated source impedance is within predetermined threshold values. The threshold values may be determined by the user or may be automatically determined as a percentage of one or more previous source impedance values.

If the estimated source impedance value is not within the predetermined threshold value with regard to a previously generated impedance value, then one or more actions may be taken. For example, in one aspect of the invention, an alarm may be provided to the user to provide information that the tolerance values have been exceeded, at block 355 (i.e., a difference between the estimated source impedance and a previously generated source impedance exceeds a desired limit). In another aspect, a modified source impedance value may be determined. In one aspect of the invention the modified source impedance value may be determined as an average of the estimated value and a previously stored source impedance value. In another aspect, the modified source impedance value may be a weighted average of the estimated value and a previously stored source impedance value. That is, the modified source impedance value may be determined as:

$$SIR_{new} = a \ast SIR_{est} + (1-a) \ast SIR_{old} \qquad (1)$$

where a represents a value between 0 and 1.

In still another aspect of the invention, the estimated SIR may be provided to a metering service wherein the estimated SIR may be compared to one or more previously measured SIR values, at block 365.

Although blocks 355-365 are shown as operating independently, it would be recognized that one or more of the processes described may be performed in series or in parallel.

In one aspect of the invention, the initially determined SIR value and the modified SIR determined at block 360 may be stored on database 325 and either value may be used by a distance algorithm at block 370 from which a distance calculation based on the modified estimated SIR may be determined. As would be recognized that in subsequent executions of equation 1 either the stored determined SIR value or the stored modified SIR value may be used as $SIR_{old}$. Use of the modified SIR value as a prior SIR value provides a smoothing effect to reduce the effect of singularities in the measurement of the SIR values.

Figure 4:
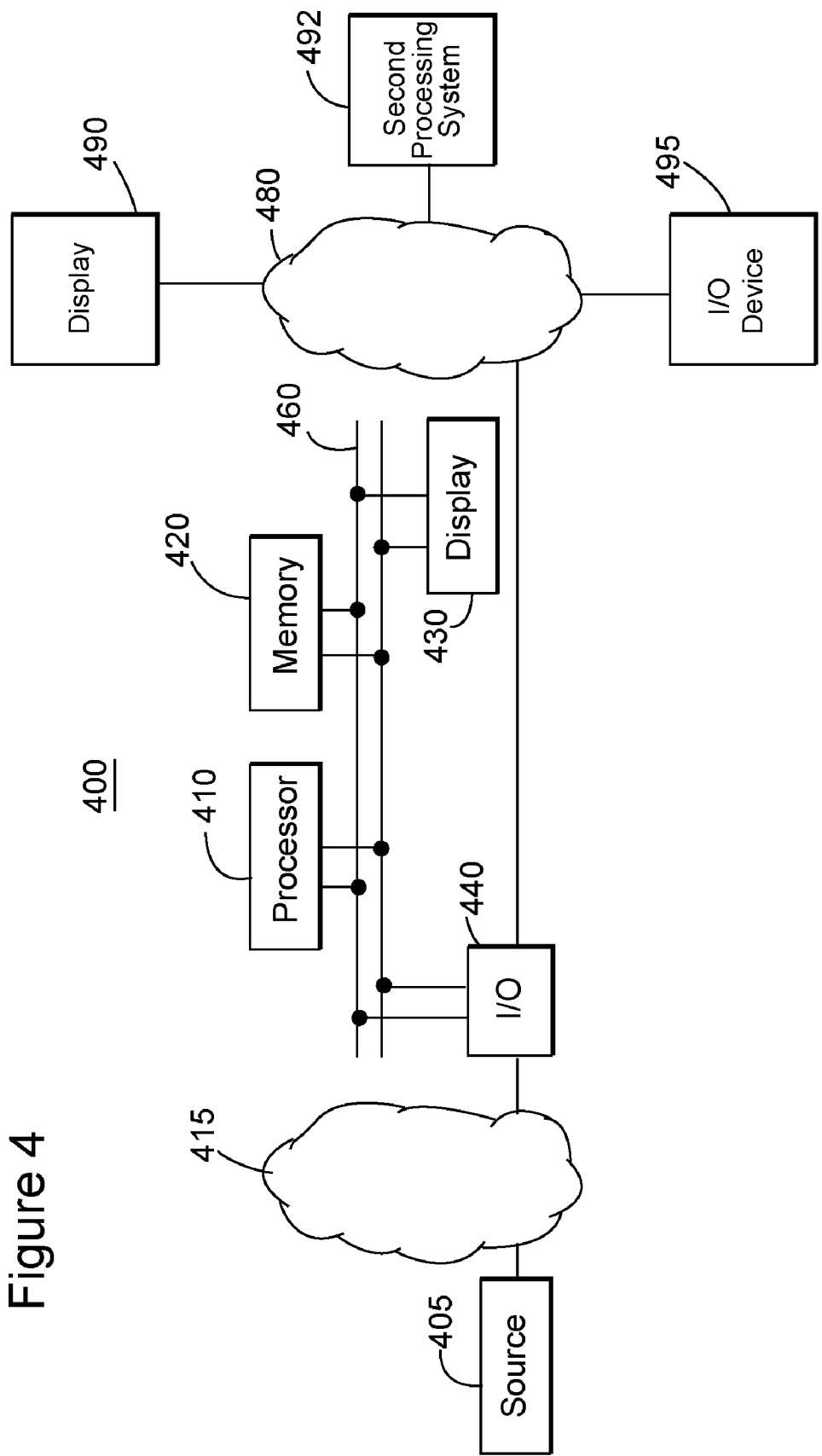
FIG. 4 is an exemplary system for executing the processing shown in FIG. 3.

FIG. 4 illustrates an exemplary system 400 for implementing the processing shown in FIG. 3. In this exemplary system embodiment, a processor (CPU) 410, memory 420, display 430, and I/O device 440 may each be in communication via a communication bus 460. Processor 410 may be any type of processor that receives known inputs and performs one or more processing steps under the direction of programming instructions. Processor 410 may be CISC (complete instruction set computer) or RISC (reduced instruction set computer) type processor. Memory 420 may be, for example, a solid-state semiconductor memory represented as RAM, ROM, EPROM, Flash, etc., that may store instructions that provide instruction to processor 410. The instructions, i.e., code, may be stored in permanent memory, e.g., PROM, and variable or changeable data may be store in RAM. The code may be provided to the memory through one or more sources, such as magnetic medium, optical medium and electronic medium via I/O device 440.

Display 430 may be used to present information regarding the status of the network to the user. Although not shown a printer may also be used to present information to the user.

I/O device 440 may provide a means for inputting and outputting information to and from processor 410. For example, I/O device 440 may receive information from one or more network nodes 405. This information may be provided to processor 410 to process the current status of the network. The current status may be displayed on display 430. Information regarding the network nodes 405 may be provided via a network 415. Network 415 may be selected from one or more networks, such as a WAN, LAN, POTS, wireless and the Internet. Information may further be provided to via network 480 to an additional display 490, other processing units 492 or to other input/output devices 495. Network 415 and 480 may be the physically or logically the same or different network systems.

It would be recognized by those skilled in the art, that the invention described herein can take the form of an entirely hardware embodiment, an entirely software embodiment, or an embodiment containing both hardware and software elements. In an exemplary embodiment, the invention may be implemented in software, which includes but is not limited to firmware, resident software, microcode, etc.

In this case, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

While there has been shown, described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps, which perform substantially the same function in substantially the same way to achieve the same results, be within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for determining a network characteristic associated with an impedance of said network, the method executable by a processor and comprising the steps of:
    determining a network status of a network condition;
    measuring an upstream voltage and an upstream current of said network based on said network status being in a first state;
    monitoring said network status;
    measuring a second upstream voltage when said network status is in a second state;
    generating a modified network characteristic dependent upon said determined network characteristic and a prior network characteristic, wherein said modified network characteristic is determined as a weighted average of said determined network characteristic and said prior network characteristic;
    determining said network characteristic dependent upon a difference between said measured upstream voltages in said first and second states relative to said measured upstream current using the processor.

2. The method as recited in claim 1, wherein said upstream voltage and upstream current are measured after determining said network is in said first state for a predetermined time period.

3. The method as recited in claim 1, further comprising the step of:
    generating an alarm when a difference between said determined network characteristic and a prior network characteristic exceeds a known limit.

4. The method as recited in claim 1, wherein said modified network characteristic is stored in a data base.

5. The method as recited in claim 1 further comprising:
    providing said determined network characteristic to a metering service for comparison with one or more prior network characteristics.

6. The method as recited in claim 1, further comprising:
    storing said determined network characteristic in a database.

7. An apparatus for determining a network characteristic associated with an impedance of said network, comprising:
    a processor in communication with a memory, said memory including code which when accessed by said processor causes said processor to execute the steps of:
    determining a network status of a network condition
    measuring an upstream voltage and an upstream current of said network based on said network status being in a first state;
    determining a change in said network status;
    measuring a second upstream voltage when said network status is in a second state;
    generating a modified network characteristic based dependent upon said determined network characteristic and a prior network characteristic, wherein said modified network characteristic is determined as a weighted average of said determined network characteristic and said prior network characteristic
    determining said network characteristic dependent upon a difference between said measured upstream voltages in said first and second states relative to said measured upstream current.

8. The apparatus as recited in claim 7, said processor further executing the steps of:
    monitoring a duration of time of said network being in said first state; and
    measuring said upstream voltage and upstream current after determining said network is in said first state for a predetermined time period.

9. The apparatus as recited in claim 7, said processor further executing the step of:
    generating an alarm when a difference between said determined network characteristic and a prior network characteristic exceeds a known limit.

10. The apparatus in claim 7, wherein said processor further executing the step of: storing said modified network characteristic in a database.

11. The apparatus as recited in claim 7, said processor further executing the step of:
    providing said determined network characteristic to a metering service for comparison with one or more prior network characteristics.

12. The apparatus as recited in claim 7, said processor further executing the step of:
    storing said determined network characteristic in a database.

* * * * *